(12) United States Patent
Gungor

(10) Patent No.: US 10,175,093 B2
(45) Date of Patent: Jan. 8, 2019

(54) APPARATUS FOR SENSING A LEVEL OF A PROCESSING MEDIUM IN A DELIVERY APPARATUS

(71) Applicant: APPLIED MATERIALS, INC., Santa Clara, CA (US)

(72) Inventor: Faruk Gungor, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 230 days.

(21) Appl. No.: 15/179,864

(22) Filed: Jun. 10, 2016

(65) Prior Publication Data
US 2016/0363478 A1     Dec. 15, 2016

Related U.S. Application Data

(60) Provisional application No. 62/175,037, filed on Jun. 12, 2015.

(51) Int. Cl.
| | |
|---|---|
| *C23C 16/448* | (2006.01) |
| *G01H 13/00* | (2006.01) |
| *G01P 15/09* | (2006.01) |
| *G01H 9/00* | (2006.01) |
| *G01F 23/28* | (2006.01) |

(52) U.S. Cl.
CPC ............. *G01H 9/00* (2013.01); *C23C 16/448* (2013.01); *G01H 13/00* (2013.01); *G01P 15/09* (2013.01); *G01F 23/28* (2013.01)

(58) Field of Classification Search
CPC .......... G01H 9/00; G01H 13/00; G01P 15/09; C23C 16/448; G01F 23/28
USPC ............................................................ 73/643
See application file for complete search history.

(56) References Cited

U.S. PATENT DOCUMENTS

| | | |
|---|---|---|
| 2002/0040592 A1 | 4/2002 | Getman et al. |
| 2004/0083963 A1 | 5/2004 | Dando et al. |
| 2006/0121198 A1 | 6/2006 | Shenai-Khatkhate et al. |
| 2008/0099933 A1 | 5/2008 | Choi et al. |
| 2014/0072479 A1 | 3/2014 | Chu et al. |

OTHER PUBLICATIONS

International Search Report and Written Opinion dated Sep. 21, 2016 for PCT Application No. PCT/US2016/037073.

*Primary Examiner* — J M Saint Surin
(74) *Attorney, Agent, or Firm* — Moser Taboada; Alan Taboada

(57) ABSTRACT

Embodiments of apparatus for sensing a level of a processing medium in a chemical delivery apparatus are provided herein. In some embodiments, a chemical delivery apparatus includes: a support structure; a container coupled to the support structure to hold a chemical precursor within an interior of the container; an excitation source configured to cause vibrations in an exterior surface of the container; and a measurement device configured to measure a frequency of the vibrations.

14 Claims, 3 Drawing Sheets

APPARATUS FOR SENSING A LEVEL OF A PROCESSING MEDIUM IN A DELIVERY APPARATUS

CROSS-REFERENCE TO RELATED APPLICATIONS

This application claims benefit of U.S. provisional patent application Ser. No. 62/175,037, filed Jun. 12, 2015, which is herein incorporated by reference.

FIELD

Embodiments of the disclosure generally relate to apparatus for sensing a level of a processing medium.

BACKGROUND

Some chemicals used in, for example, semiconductor device processing or other thin film fabrication processes, are delivered into a process chamber using an ampoule. Such ampoules typically include a canister that is in fluid communication with an inlet port and an outlet port using a carrier gas that is fed through the ampoule. For example, the carrier gas is fed into the liquid using a bubbler tube, saturates the fluid, and carries away some of the liquid. As another example, the carrier gas is fed into a space above the liquid, may flow over the liquid, and carries away vapor from the space above the liquid. The ampoule may be used until all liquid is removed, at which time the ampoule is refilled or replaced.

Accordingly, the inventor has provided improved method and apparatus for measuring the level of a processing medium to be provided in a substrate process.

SUMMARY

Embodiments of apparatus for sensing a level of a processing medium in a chemical delivery apparatus are provided herein. In some embodiments, a chemical delivery apparatus includes: a support structure; a container coupled to the support structure to hold a chemical precursor within an interior of the container; an excitation source configured to cause vibrations in an exterior surface of the container; and a measurement device configured to measure a frequency of the vibrations.

In some embodiments a chemical delivery apparatus includes: a support structure; a container coupled to the support structure to hold a chemical precursor within an interior of the container; an excitation source configured to cause vibrations in an exterior surface of the container; a measurement device configured to measure a frequency of the vibrations; and a cantilevered beam coupled to an interior of the container at a first end of the cantilevered beam, wherein the measurement device is coupled to the cantilevered beam at a second end opposite the first end.

In some embodiments a chemical delivery apparatus includes: a support structure; a container coupled to the support structure to hold a chemical precursor within an interior of the container; an excitation source configured to cause vibrations in an exterior surface of the container; a measurement device configured to measure a frequency of the vibrations; and a thin-walled container disposed within the container and coupled to sidewalls of the container, wherein the measurement device is coupled to the thin-walled container.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
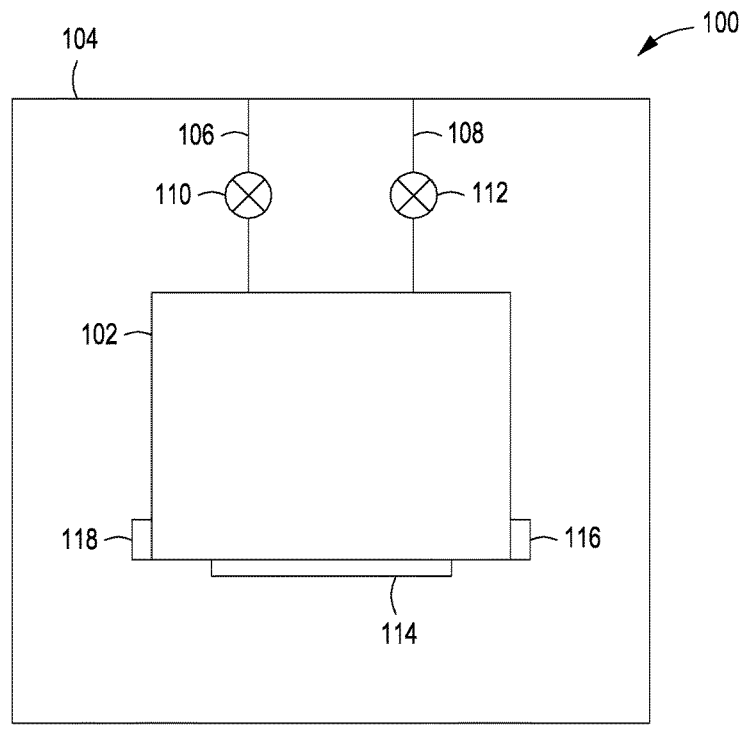
FIG. 1 is a schematic view of an example of a chemical delivery apparatus in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure relate to methods and apparatus for determining a level of precursor materials to be used in a process chamber, such as a substrate process chamber for processing semiconductor or other substrates used in microelectronic fabrication. Embodiments of the present disclosure may advantageously facilitate determining a level of a chemical disposed in a container, such as an ampoule.

FIG. 1 is a schematic view of a chemical delivery apparatus 100 in accordance with some embodiments of the present disclosure. The chemical delivery apparatus 100 includes a container (e.g., ampoule 102) coupled to a support structure 104. In some embodiments, a chemical precursor can flow into the ampoule 102 through an inlet tube 106. Alternatively, a carrier gas may be provided through the inlet tube 106. In some embodiments, the inlet tube 106 can be coupled to both a chemical precursor source and a carrier gas source and can selectively provide at least one of the chemical precursor or the carrier gas into the ampoule 102. In some embodiments, a separate fill tube or port may be provided to facilitate refilling the ampoule 102 with the chemical precursor.

The ampoule 102 further comprises an outlet tube 108 to facilitate flowing the vaporized chemical precursor out of the ampoule 102. The vaporized chemical precursor may be flowed out of the ampoule 102 via the carrier gas, via vacuum draw, or via any other suitable means. A first valve 110 and a second valve 112 may be coupled to the inlet tube 106 and the outlet tube 108, respectively, to selectively open/close the inlet and outlet tubes 106, 108. The chemical delivery apparatus 100 further includes a heating element 114 to heat the chemical precursor within the ampoule 102.

The inventor has discovered that the ampoule 102 with the support structure 104, heating element 114, and precursor (i.e., "the system") can be modeled as a mass-damper-spring system that will vibrate in response to an excitation force. The chemical delivery apparatus 100 illustratively depicted above can include additional components, such as other ports, valves, tubes, structural support members, or the like, which will be part of the mass-damper-spring system. The system is continuous and will have several mode shapes and corresponding natural frequencies. As the precursor level changes, the dynamics of the system will also change, thus resulting in a different natural frequency. The change in natural frequencies can be used to determine the level of precursor remaining in the ampoule 102. Therefore, the amount of precursor chemical left in the ampoule can be determined by the systems response to an excitation force. As such, the inventor has developed a level sensing apparatus including an excitation source 116 and a measurement device 118 to measure a frequency of vibrations caused by the excitation source 116.

In some embodiments, the excitation source 116 may be a pneumatic or electrical device that exerts a force on an exterior surface of the ampoule 102 causing vibrations. For example, the excitation source may be an impulse hammer or an electromagnetic shaker. In some embodiments, the excitation source 116 may be disposed within the ampoule 102. In such an embodiment, the excitation source may be, for example, an eccentric motor.

In some embodiments, the measurement device 118 may be an accelerometer (e.g., a piezoelectric accelerometer) mounted on the exterior surface of the ampoule 102 and configured to measure a frequency of the vibrations caused by the excitation source 116. In some embodiments, the measurement device 118 may alternatively be a laser vibrometer mounted externally to the ampoule 102 and having a laser directed at the external surface of the ampoule 102 to measure the frequency of the vibrations caused by the excitation source 116. In some embodiments, the measurement device 118 may be an acoustic measurement device such as, for example, a high sensitivity high resolution microphone configured to listen to the system's response.

FIGS. 2-5 depict schematic views of alternate embodiments of a chemical delivery apparatus having alternate configurations of an excitation source and measurement device in accordance with some embodiments of the present disclosure. A description of elements previously described with regards to the chemical delivery apparatus 100 of FIG. 1 will be omitted for clarity. In the embodiments of FIGS. 2-5, the measurement device is coupled to a structure that is less rigid than the ampoule. As a result, the structure is more sensitive to vibrations caused by the excitation source than the ampoule itself.

Figure 2:
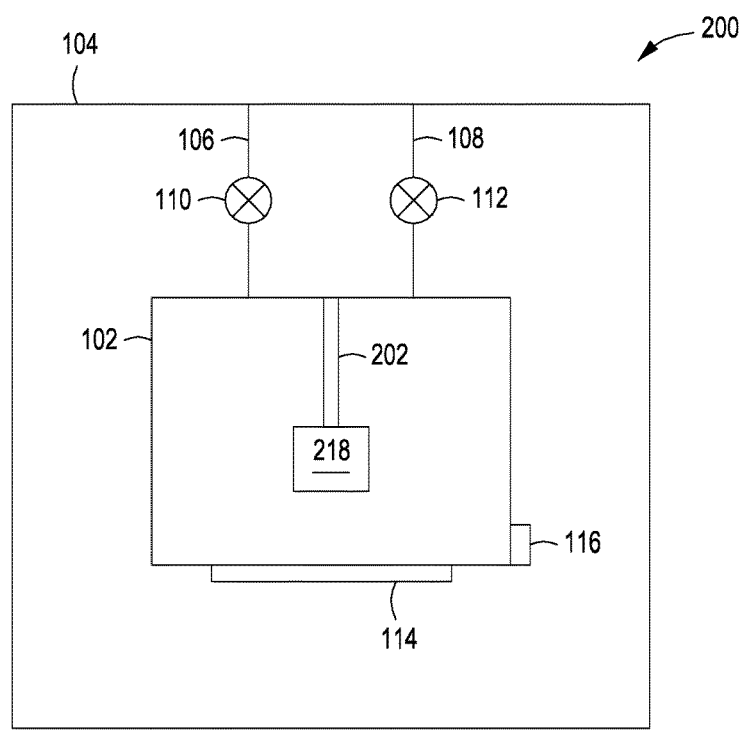
FIG. 2 is a schematic view of an example of a chemical delivery apparatus in accordance with some embodiments of the present disclosure.

FIG. 2 depicts a schematic view of a chemical delivery apparatus 200 in accordance with some embodiments of the present disclosure. In the embodiment of FIG. 2, a cantilevered beam 202 is coupled to an upper surface of the ampoule 102 at a first end and a measurement device 218 is coupled to a second end opposite the first end of the cantilevered beam 202. In some embodiments, the cantilevered beam 202 may be removably coupled to the upper surface of the ampoule 102 via a fixation element such as, for example, a screw, bolt, clamp, or other suitable mechanism for removably coupling the cantilevered beam 202 to the ampoule 102. In some embodiments, the cantilevered beam 202 may alternatively be permanently coupled to the upper surface of the ampoule 102 via welding. In some embodiments, the cantilevered beam 202 may be metallic. For example, the cantilevered beam 202 may be formed of stainless steel or from the same material as the ampoule 102. In the embodiment illustrated in FIG. 2, the cantilevered beam 202 extends from an upper surface of the ampoule 102 into the interior volume of the ampoule 102 proximate the bottom surface of the ampoule 102. Because the cantilevered beam 202 is cantilevered, the cantilevered beam 202 is less rigid than the ampoule 102 and is, therefore, more sensitive to vibrations caused by the excitation source 116. In some embodiments, the measurement device 218 may alternatively be disposed at any position along the length of the cantilevered beam 202.

Figure 3:
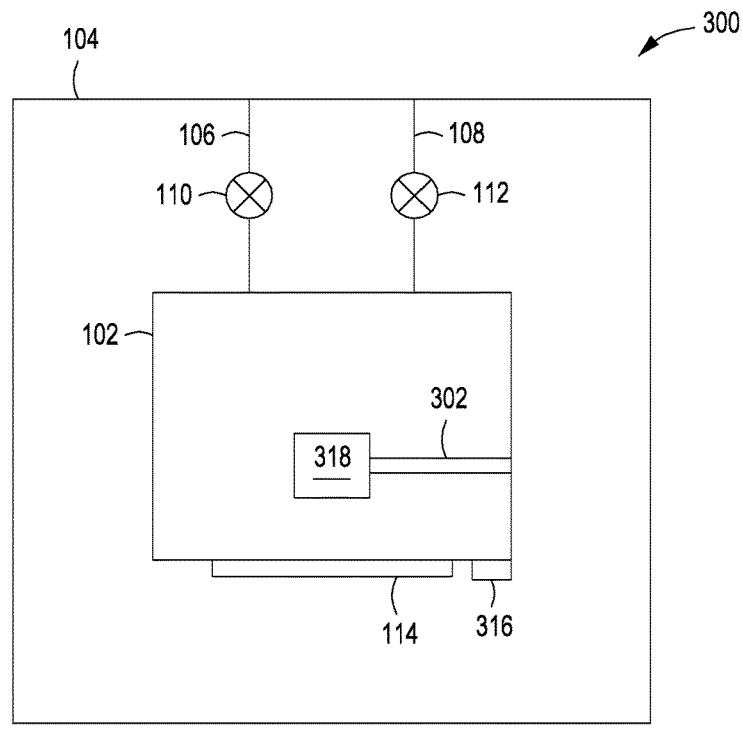
FIG. 3 is a schematic view of an example of a chemical delivery apparatus in accordance with some embodiments of the present disclosure.
Figure 4:
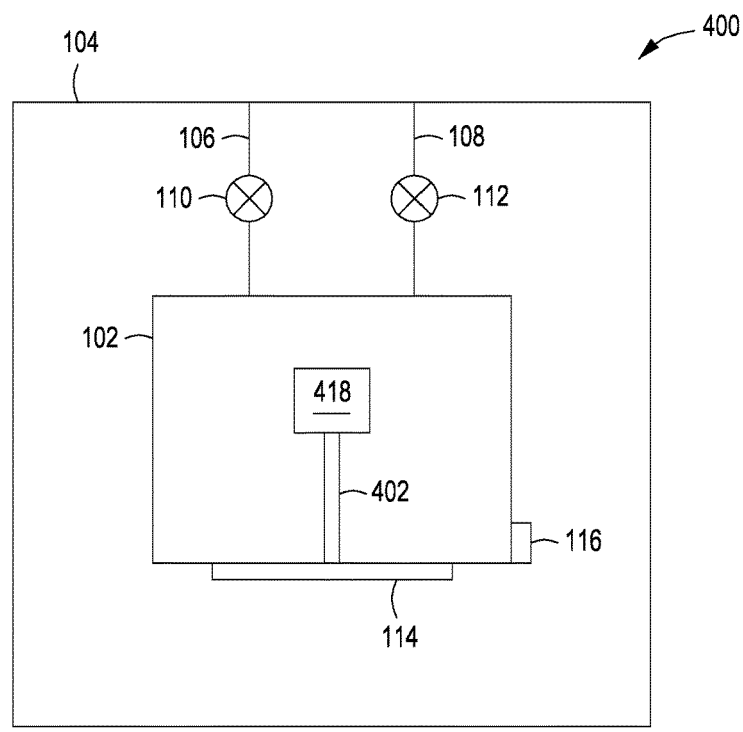
FIG. 4 is a schematic view of an example of a chemical delivery apparatus in accordance with some embodiments of the present disclosure.

FIG. 3 depicts a schematic view of a chemical delivery apparatus 300 and FIG. 4 depicts a schematic view of a chemical delivery apparatus 400 in accordance with some embodiments of the present disclosure. The chemical delivery apparatuses 300, 400 are substantially similar to the chemical delivery apparatus 200 described above, except for the positions of the beams 302, 402. In the chemical delivery apparatus 300 depicted in FIG. 3, the cantilevered beam 302 is coupled to a sidewall of the ampoule 102 at a first end and a measurement device 318 is coupled to the cantilevered beam 302 at a second end opposite the first end. In the chemical delivery apparatus 400 depicted in FIG. 4, the cantilevered beam 402 is coupled to a bottom surface of the ampoule 102 at a first end and a measurement device 418 is coupled to the cantilevered beam 402 at a second end opposite the first end. In addition, because the cantilevered beam 302 extends laterally across the ampoule 102 and not vertically (i.e., top to bottom), the excitation source 316 may be coupled to one of the bottom or upper surface of the ampoule 102 so that the vibrations extend transverse to the cantilevered beam 302 and not along the cantilevered beam 302. As a result, a more accurate measurement is made by the measurement device 318 because vibrations transmitted directly to the cantilevered beam 302 by the excitation source 316 are avoided.

Figure 5:
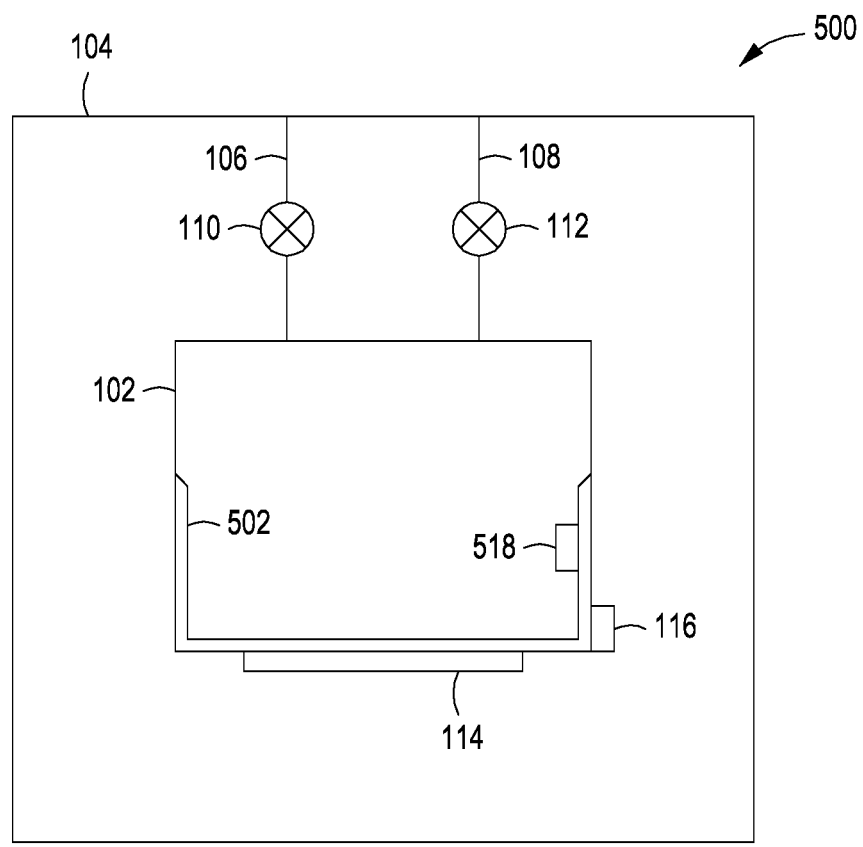
FIG. 5 is a schematic view of an example of a chemical delivery apparatus in accordance with some embodiments of the present disclosure.

FIG. 5 depicts a schematic view of a chemical delivery apparatus 500 in accordance with some embodiments of the present disclosure. In the embodiment of FIG. 5, a thin-walled container 502 is disposed within the ampoule 102. The thin-walled container 502 has walls that are thinner than the walls of the ampoule 102. In some embodiments, the thin-walled container 502 is removably coupled to the sidewalls of the ampoule 102 using fixation elements such as, for example, screws, bolts, clamps, or other suitable mechanisms for removably coupling the thin-walled container 502 to the ampoule 102. In some embodiments, the thin-walled container 502 is permanently coupled to the ampoule 102 via welding. Similar to the beams described above, the thin-walled container 502 may be metallic. For example, the thin-walled container 502 may be formed of stainless steel or from the same material as the ampoule 102. Also similar to the beams described above, the thin-walled container 502 is less rigid than the ampoule 102, thus making the thin-walled container 502 more sensitive to vibrations caused by the excitation source 116. The thin-walled container 502 acts as the holding volume for the chemical precursor. A measurement device 518 is coupled to a sidewall of the thin-walled container 502 to measure the frequency of the vibrations caused by the excitation source 116. As such, when the excitation source 116 causes an excitation (e.g., vibration), the thin-walled container 502 and the chemical precursor are caused to vibrate and the frequency of the vibrations are measured by the measurement device 518.

Other embodiments of a chemical delivery apparatus incorporating one or more of the above-described features are contemplated. While the foregoing is directed to some embodiments of the present disclosure, other and further embodiments may be devised without departing from the basic scope thereof.

The invention claimed is:

1. A chemical delivery apparatus, comprising:
a support structure;
a container coupled to the support structure to hold a chemical precursor within an interior of the container;
an excitation source configured to cause vibrations in an exterior surface of the container;
a measurement device configured to measure a frequency of the vibrations; and
a cantilevered beam coupled to an interior of the container at a first end of the cantilevered beam, wherein the measurement device is coupled to the cantilevered beam.

2. The chemical delivery apparatus of claim 1, wherein the excitation source is coupled to the exterior surface.

3. The chemical delivery apparatus of claim 1, wherein the excitation source is disposed within the container.

4. The chemical delivery apparatus of claim 3, wherein the excitation source is an eccentric motor.

5. The chemical delivery apparatus of claim 1, wherein the measurement device is coupled to a second end of the cantilevered beam opposite the first end.

6. The chemical delivery apparatus of claim 5, wherein the excitation source is coupled to the container at a position such that vibrations caused by the excitation source extend transverse to the cantilevered beam.

7. A chemical delivery apparatus, comprising:
a support structure;
a container coupled to the support structure to hold a chemical precursor within an interior of the container;
an excitation source configured to cause vibrations in an exterior surface of the container;
a measurement device configured to measure a frequency of the vibrations; and
a cantilevered beam coupled to an interior of the container at a first end of the cantilevered beam, wherein the measurement device is coupled to the cantilevered beam at a second end opposite the first end.

8. The chemical delivery apparatus of claim 7, wherein the cantilevered beam is removably coupled to the container.

9. The chemical delivery apparatus of claim 7, wherein the cantilevered beam is permanently coupled to the container.

10. The chemical delivery apparatus of claim 7, wherein the cantilevered beam is formed of stainless steel.

11. The chemical delivery apparatus of claim 7, wherein the excitation source is coupled to the container at a position such that vibrations caused by the excitation source extend transverse to the cantilevered beam.

12. A chemical delivery apparatus, comprising:
a support structure;
a container coupled to the support structure to hold a chemical precursor within an interior of the container;
an excitation source configured to cause vibrations in an exterior surface of the container;
a measurement device configured to measure a frequency of the vibrations; and
a thin-walled container disposed within the container and coupled to sidewalls of the container, wherein the measurement device is coupled to the thin-walled container.

13. The chemical delivery apparatus of claim 12, wherein the thin-walled container is removably coupled to the container.

14. The chemical delivery apparatus of claim 12, wherein the thin-walled container is permanently coupled to the container.

* * * * *